United States Patent [19]

Shiokawa

[11] Patent Number: 4,562,352
[45] Date of Patent: Dec. 31, 1985

[54] ANALYZING APPARATUS CAPABLE OF ANALYZING A SURFACE AT A HIGH RESOLUTION

[75] Inventor: Yoshiro Shiokawa, Tokyo, Japan
[73] Assignee: Anelva Corporation, Tokyo, Japan
[21] Appl. No.: 639,367
[22] Filed: Aug. 9, 1984
[30] Foreign Application Priority Data Aug. 10, 1983 [JP] Japan ................................ 58-145090

[51] Int. Cl.$^4$ .......................................... H01J 37/252
[52] U.S. Cl. ..................................... 250/305; 250/310
[58] Field of Search ................................ 250/305, 310

[56] References Cited

U.S. PATENT DOCUMENTS 4,100,409 7/1978 Brongersma ......................... 250/305
4,205,226 5/1980 Gerlach ............................... 250/305

*Primary Examiner*—Alfred E. Smith
*Assistant Examiner*—Jack I. Berman
*Attorney, Agent, or Firm*—Laff, Whitesell, Conte & Saret

[57] ABSTRACT

In an analyzing apparatus for use in analyzing a surface of an object by the use of Auger electrons resulting from impingement of an electron beam, outer and inner cylindrical electrode members are placed to define outer and inner rooms, respectively, and have a common cylindrical axis. The outer and the inner rooms have first outer and first inner ends adjacent to the object, respectively, and second outer and second inner ends remote from the object, respectively. An electron gun is operable to radiate the electron beam and is entered at least partly in the outer room with an electron gun axis noncoincident with the common cylinder axis. The electron gun axis and the common cylinder axis form a predetermined angle. An ion gun is also entered at least partly in the outer room with an ion gun axis noncoincident with the electron gun axis. Various kinds of detectors may be placed in the inner room.

32 Claims, 14 Drawing Figures

ANALYZING APPARATUS CAPABLE OF ANALYZING A SURFACE AT A HIGH RESOLUTION

BACKGROUND OF THE INVENTION

This invention relates to an analyzing apparatus for analyzing a surface of an object by charged particles, such as the Auger electrons known in the art. More particularly, this invention is applicable to an analyzing apparatus comprising a cylindrical mirror type analyzer for analyzing energy of the charged particles which are emitted from the surface.

As will later be described with reference to a few of fourteen figures of the accompanying drawing, a conventional analyzing apparatus of the type described comprises a radiant beam radiator which has a radiant beam radiator axis and which radiates a radiant beam, such as an electron beam, onto the surface of the object to make the surface emit the charged particles.

The cylindrical mirror type analyzer comprises outer and inner coaxial cylindrical electrode members having a common cylinder axis which is coincident with the principal axis. The outer and the inner cylindrical electrode members define an outer and an inner room, respectively. A space is defined between the outer and the inner cylindrical electrode members. The inner cylindrical electrode member has an inlet and an outlet opening each of which surrounds the principal axis.

The cylindrical mirror type analyzer acts to analyze the charged particles which enter the space through the inlet opening and come out thereof through the outlet opening.

In one of such conventional analyzing apparatus, the radiant beam radiator and the cylindrical mirror type analyzer are individually attached to an inner surface of a vacuum vessel with the radiant beam radiator disposed outwardly of the outer cylindrical electrode member. With this structure, the radiant beam radiator can not be disposed nearer to the surface of the object than the outer cylindrical electrode member. Therefore, the radiant beam has a wide diameter on the surface. As a result, it is impossible to obtain a high resolution of analysis. In addition, the analyzer and the radiant beam radiator should individually and precisely be assembled in the vacuum vessel. Such a precise assembly is laborious and difficult. On the other hand, they must be disassembled from each other on maintenance or sweep of the analyzing apparatus. The above-mentioned structure makes such a disassembly cumbersome and difficult on maintenance or sweep of the apparatus.

An etching beam radiator is often housed in the vacuum vessel to radiate an etching beam, such as an ion beam, onto the surface of the object and to thereby etch the surface. The surface of the object is etched by the etching beam in a direction of a depth of the object. The etching beam radiator is necessary in carrying out the elementary analysis along the direction of the depth. The etching beam radiator gives rise to a like problem.

Another of the conventional analyzing apparatus is disclosed in U.S. Pat. No. 4,048,498 issued to Robert L. Gerlach et al. In the analyzing apparatus according to Gerlach et al, the radiant beam radiator is disposed in the inner room with the radiant beam radiator axis rendered coincident with the principal axis. With this structure, it is possible to obtain a high resolution because the radiant beam radiator can be disposed adjacently of the surface of the object. However, it is necessary to miniaturize the radiant beam radiator so as to be placed in the inner room. Thus, the high resolution is achieved at the cost of simpleness of the structure.

Still another of the conventional analyzing apparatus is revealed in U.S. Pat. No. 4,205,226 issued singly to Robert L. Gerlach. In the Gerlach analyzing apparatus, the radiant beam radiator is disposed along the principal axis from outside of the inner room into inner room. The radiant beam radiator axis is coincident with the principal axis.

With the Gerlach analyzing apparatus, it is also possible to obtain a high resolution because the radiant beam can be disposed adjacently on the surface of the object.

However, the radiant beam is incident onto a surface of an object along the radiant beam radiator axis. The incidence of the radiant beam onto the surface gives rise to emission of charged particles from the surface. The charged particles are finally collected on a sensor arranged along the radiant beam radiator axis. Inasmuch as the radiant beam and the sensor are coaxial, the sensor should be provided with an aperture through which the radiant beam passes. Precise working of the sensor is necessary to form the aperture. Thus, the high resolution is achieved at the cost of simpleness of the structure.

In either of the analyzing apparatus according to Gerlach et al and to Gerlach alone, the etcing beam radiator is placed at the outside of the analyzer. Therefore, a large angle is formed between the etching beam radiator and the radiant beam radiator. As a a result, a resolution of analysis is low in the direction of the depth of the object. At any rate, each analyzing apparatus is disadvantageous in that assembly and disassembly are difficult on manufacturing and maintaining the apparatus, respectively, like the aforementioned conventional apparatus.

SUMMARY OF THE INVENTION

It is therefore a general object of this invention to provide an analyzing apparatus which is capable of analyzing a surface of an object at a high resolution.

It is another object of this invention to provide an analyzing apparatus of the type described which is simple in structure.

It is a further object of this invention to provide an analyzing apparatus of the type described, which can be readily assembled and maintained.

It is a specific object of this invention to provide an analyzing apparatus of the type described, which is capable of obtaining a high resolution in the direction of the depth of an object to be analyzed.

An analyzing apparatus to which this invention is applicable has a principal axis and comprises holding means for holding an object having a surface with the surface disposed transversely of the principal axis, beam radiating means for radiating a radiant beam onto the surface to make the surface emit charged particles, and a cylindrical mirror type analyzer which comprises an outer and an inner cylindrical electrode member having a common cylinder axis coincident with the principal axis to define a space therebetween. The outer and the inner cylindrical electrode members define an outer and an inner room, respectively. The inner cylindrical electrode member has an inlet and an outlet opening which surround the principal axis adjacent and remote from the holding means, respectively. The cylindrical mirror type analyzer is for analyzing the charged particles which enter the space through the inlet opening to come out thereof through the outlet opening. According to this invention, the beam radiating means comprises a beam radiator having a radiator axis and a beam radiating opening for radiating the radiant beam through the radiating opening. The radiator axis is extended at least partly in the outer room and is noncoincident with the principal axis. The beam radiating opening is disposed adjacent to the holding means. The beam radiating means comprises directing means for directing the radiant beam radiated through the beam radiating opening onto the surface at a predetermined angle relative to the principal axis.

According to an aspect of this invention, the analyzing apparatus further comprises an etching beam radiator for radiating an etching beam onto the surface to etch the surface. The etching beam radiator is extended at least partly in the outer room.

DESCRIPTION OF THE PREFERRED EMBODIMENTS

Prior Art (Part 1)

Figure 1:
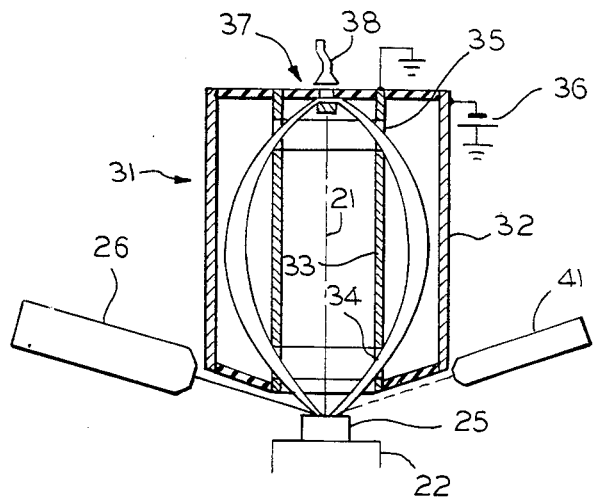
FIG. 1 is a schematic vertical sectional view of a conventional analyzing appartus.

Referring to FIG. 1, a conventional analyzing apparatus will be described at first in order to facilitate an understanding of the present invention. The analyzing apparatus is an Auger electron spectrometer and has a principal axis 21. The analyzing apparatus comprises a holding pedestal 22 on which an object 25 is supported. The object 25 has a surface transversely of the principal axis 21. An electron gun 26 is placed along an electron gun axis and is for radiating an electron beam onto the surface to make the surface emit the Auger electrons known in the art. The electron gun 26 is therefore operable as a radiant beam radiator.

A cylindrical mirror type analyzer 31 comprises outer and inner coaxial cylindrical electrode members 32 and 33 having a common cylinder axis which is coincident with the principal axis 21. A space is defined between the outer and the inner cylindrical electrode members 32 and 33. The outer and the inner cylindrical electrode members 32 and 33 define an outer and an inner room, respectively. The inner cylindrical electrode member 33 has inlet and outlet openings 34 and 35 which surround the principal axis 21 and which are adjacent to and remote from the holding pedestal 22, respectively.

The inner cylindrical electrode member 33 is grounded. An electric voltage source 36 is for supplying the outer cylindrical electrode member 32 with an electric voltage which is negative relative to ground. The outer and the inner cylindrical electrode members 32 and 33 are electrically insulated from each other so that the electric voltage develops an electric potential difference between the outer and the inner cylindrical electrode members 32 and 33 and to provide an electric field in the space.

The cylindrical mirror type analyzer 31 is for analyzing the Auger electrons which enter the space through the inlet opening 34 to come out thereof through the outlet opening 35. The cylindrical mirror type analyzer 31 has an electron collecting portion 37 for collecting the Auger electrons which have come out of the space through the outlet opening 35. The electron collecting portion 37 comprises a detecting part 38 for Auger electrons. Those of the Auger electrons are focused at an entrance of the detecting part 38 which have specific kinetic energy determining by the electric potential difference between the outer and the inner cylindrical electrode members 32 and 33.

An ion gun 41 is operable as an etching beam radiator. The ion gun 41 has an ion gun axis and radiates an ion beam onto the surface of the object 25 to etch the surface. The ion gun 41 is used in carrying out the elementary analysis into a depth of the object 25.

The cylindrical mirror type analyzer 31, the electron gun 16, and the ion gun 41 are housed in a vacuum vessel (not shown) and individually attached to an inner surface thereof. The electron gun 26 and the ion gun 41 are disposed outwardly of the analyzer 31.

With this structure, the electron beam has a wide diameter on the surface because the electron gun 26 can not be brought nearer to the surface of the object 25 than the outer cylindrical electrode member 32. As a result, it is impossible to achieve a high spatial resolution of analysis. Besides, the illustrated analyzing apparatus is disadvantageous in that assembly and disassembly are cumbersome, as pointed out in the preamble of the instant specification.

Prior Art (Part 2)

Figure 2:
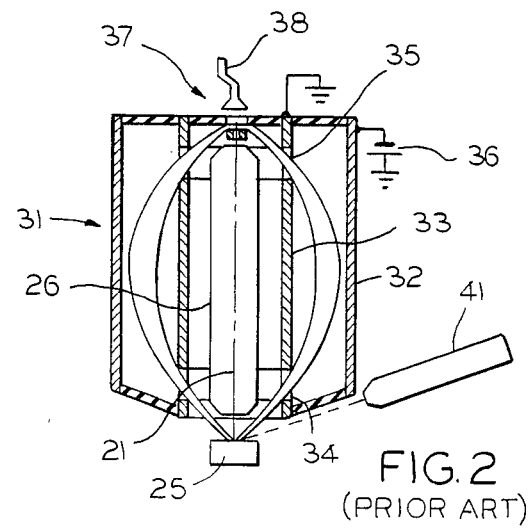
FIG. 2 is a similar view of another conventional analyzing apparaus.

Referring to FIG. 2, another conventional analyzing apparatus comprises similar parts designated by like reference numerals. In the analyzing apparatus being illustrated, the electron gun 26 is disposed in the inner room with the electron gun axis rendered coincident with the principal axis 21.

With this structure, the electron gun 26 can be disposed in close vicinity of the surface of the object 25. It is therefore possible to obtain a high spatial resolution. However, it is necessary to miniaturize the electron gun 26 so that the electron gun 26 can be put in the inner room. Thus, the high spatial resolution is achieved at the cost of simpleness of the structure.

In addition, the ion gun 41 is placed at the outside of the analyzer 31. Therefore, a larger angle is formed between the ion gun axis and the electron gun axis. Consequently, a resolution is low in the direction of the depth of the object 25. Besides, assembly and disassembly are troublesome on manufacturing and repairing the illustrated apparatus.

Prior Art (Part 3)

Figure 3:
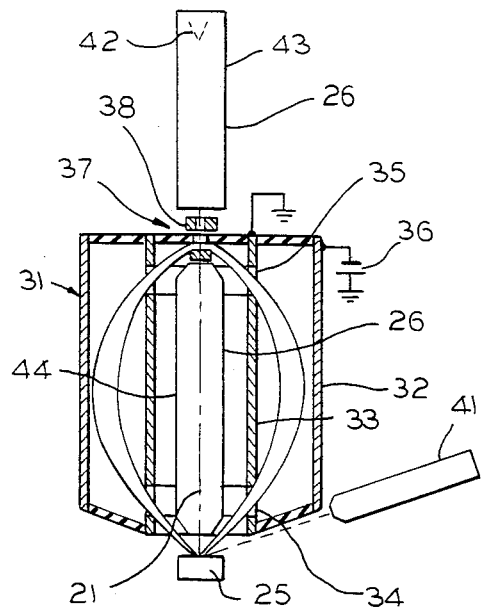
FIG. 3 is a similar view of a further conventional analyzing apparatus.

Referring to FIG. 3, a conventional analyzing apparatus is similar to that illustrated in FIG. 2 except that the electron gun 26 (FIG. 3) is partly protruded along the principal axis 21 from the inner room. The electron gun axis is coincident with the principal axis 21. The illustrated electron gun 26 comprises an electron beam source 42 outwardly of the inner room so as to generate the electron beam, a first tube portion 43 outwardly of the inner room, and a second tube portion 44 inwardly of the inner room. The first and the second tube portions 43 and 44 are for guiding the electron beam generated by the electron beam source 42 along the electron gun axis to the surface of the object 25. The electron beam is exposed to a hollow space of the vacuum vessel at a portion between the first and the second tube portions 43 and 44. The exposed electron beam passes through an aperture formed in the detecting part 38 and an aperture formed in the other part of the electron collecting portion 37.

With this structure, it is also possible to obtain a high spatial resolution because the electron gun 26 can be disposed in close vicinity of the surface. However, accurate machining is necessary to form the apertures in the electron collecting portion 37, as mentioned in the preamble of the instant specification.

In addition, the ion gun 41 is placed at the outside of the analyzer 31. Therefore, a larger angle is formed between the ion gun axis and the electron gun axis. Consequently, a resolution is low in the direction of the depth of the object 25 like the analyzing apparatus illustrated with reference to FIG. 2. Besides, there are disadvantages in the accuracy of assembling, in maintenance, and in cost, like in FIGS. 1 and 2.

PRINCIPLES OF THE INVENTION

In FIGS. 1 to 3, the outer and the inner rooms have first outer and first inner ends which are adjacent to the holding pedestal 22, respectively, and are directed towards the bottom of the figure. Furthermore, the outer and the inner rooms have second outer and second inner ends which are remote from the holding pedestal 22, respectively, and which are directed towards the top of the figure.

In FIGS. 1 to 3, the inner room defined by the inner cylindrical member 33 is almost closed at the second inner end with only a narrow aperture partly left. The electron gun 26 alone is accommodated in the closed inner room, as shown in FIG. 2.

However, it has been found that a plurality of guns may be inserted into the inner room with the guns partly protruded from the inner room and that the inner room is not always closed at the second inner end. The reasons will be described hereinafter.

At first, the inner room forms a free space having an invariable potential because the inner cylindrical member 33 is grounded. From this fact, it is readily understood that the plurality of the guns, such as the electron gun 26, the ion gun 41, and the like, may be housed in the inner room even when they have different geometrical configurations, if they are kept at the electric potential of the inner cylindrical member 33.

Secondly, each of the electron gun 26 and the ion gun 41 has either the electron beam source or the ion beam source at one end thereof and the guide tube having a lens portion for convergence of each of the electron and the ion beams. Each of the electron and the ion beam sources is irreducible in size while the guide tube can readily be slender. In addition, each of the electron and the ion beams is partly exposed to the inner room when the inner room is the free space.

Thirdly, the sensor or the detecting portion 38 is placed outside the inner room and is supplied with a high electric voltage. In order to protect the potential in the inner room from being varied due to supply of the high electric voltage, the inner room is closed at the second inner end. However, the inner room may be opened at the second inner end when the sensor 38 is shielded by a metal casing.

First Embodiment

Figure 4:
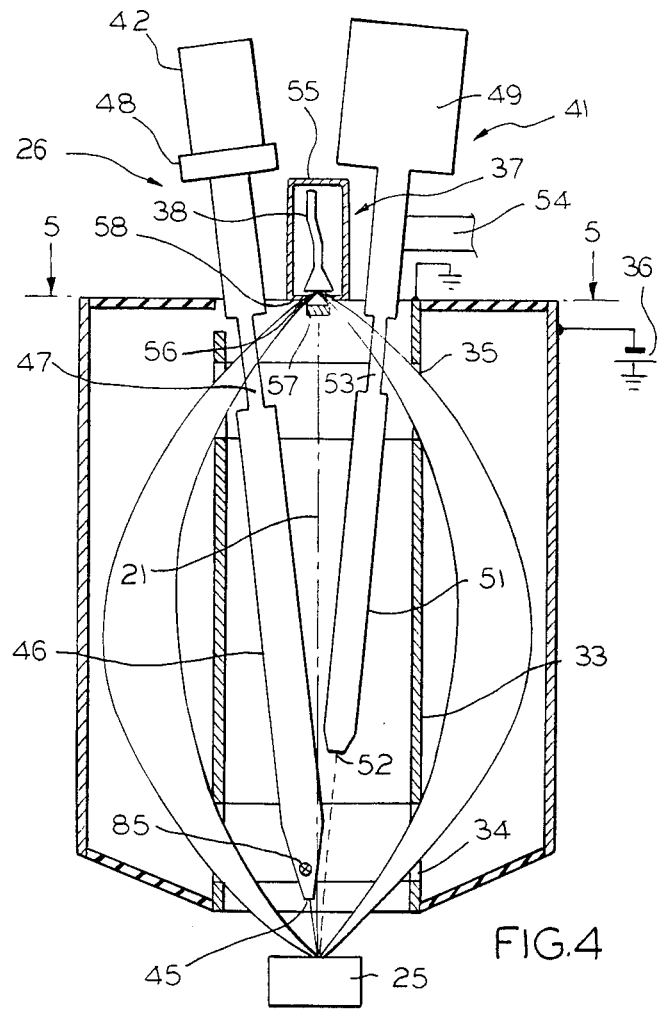
FIG. 4 is a vertical sectional view of an analyzing apparatus according to a first embodiment of this invention.
Figure 5:
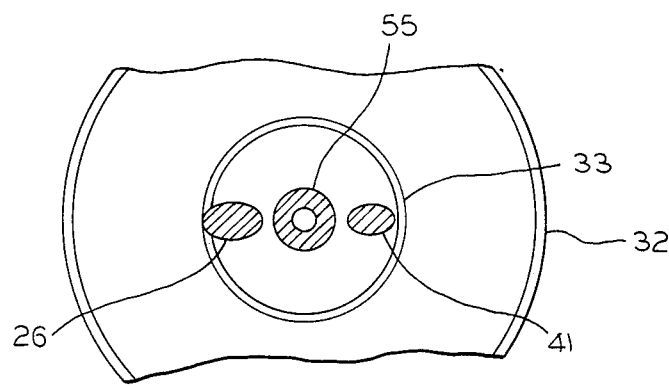
FIG. 5 is a schematic cross-sectional view taken along a line 5—5 of FIG. 4.

Referring to FIGS. 4 and 5, an analyzing apparatus according to a first embodiment of this invention comprises similar parts designated by like reference numerals. The first and the second inner ends are opened as best shown in FIG. 4. The first and second outer ends are closed except the first and the second inner ends.

The illustrated electron gun 26 has an electron gun axis which is extended partly in the outer room and which is noncoincident with the principal axis 21. More specifically, the electron gun axis is coplanar with the principal axis 21 and forms a predetermined angle with the principal axis 21. The predetermined angle may be, for example, between 5° and 10°. The electron gun axis is extended upwardly and downwardly through the second inner end. The illustrated electron gun axis is not concurrent with the principal axis 21.

The electron gun 26 further has a lower end defining an electron beam radiating opening 45 through which the electron beam is radiated onto the surface of the object 25 at the predetermined angle. In the example being illustrated, the electron beam travels straight towards the surface without any deflection.

The illustrated electron gun 26 comprises an electron beam source 42 outwardly of the outer room. The electron beam source 42 is for generating the electron beam. An electron beam guide tube 46 has a lower end which defines the electron beam radiating opening 45. The electron beam guide tube 46 guides the electron beam generated by the electron beam source 42 along the electron gun axis to the electron beam radiating opening 45. The electron beam guide tube 46 is rendered slim at a portion 47 at which the electron beam guide tube 46 intersects the Auger electrons emitted from the surface of the object 25. The electron gun 26 further comprises a fine adjustment mechanism symbolically depicted at 48. The first adjustment mechanism 48 is for making the electron beam generated by the electron beam source 43 coincide with the electron gun axis.

The ion gun 41 has an ion gun axis extended at least partly in the outer room, an upper end extended through the second inner end, and a bottom end terminated in the inner room. Like the electron gun axis, the ion gun axis is coplanar with the principal axis 21 and yet is not concurrent with the principal axis 21. The ion gun axis is coplanar with the principal axis 21 and the electron gun axis.

The ion gun 41 comprises an ion beam source 40 outwardly of the outer room so as to generate the ion beam and an ion beam guide tube 51 having an ion beam radiating opening 52. The ion beam guide tube 51 guides the ion beam generated by the ion beam source 49 along the ion beam radiator axis to the ion beam radiating opening 52. The ion beam guide tube 51 is rendered slim at a portion 53 at which the ion beam guide tube 51 intersects the Auger electrons emitted from the surface of the object 25.

The ion beam source 49 has an ion source chamber filled with a gas, such as argon gas or the like, which is to be dissociated into ions. The ions are radiated from the chamber onto the object 25 through the ion beam guide tube 51. The gas might objectionably leak from the ion beam guide tube 51. In addition, undesired gases might be emitted from a wall of the ion source chamber and leak into the vacuum vessel. Such leakage of the gases should be avoided. For this purpose, an exhaust pipe 54 is connected to that portion of the ion beam guide tube 51 which is situated outside the second inner end. The exhaust pipe 54 is coupled to an exhaust pump (not shown) independent of the other exhaust pump or pumps for evacuating the vacuum vessel. As readily understood from FIG. 4, the ion beam source 49 is placed outside the second inner end and the second outer end. Under the circumstances, the ion beam source 49 may be enlarged in size and filled with the gas at a high pressure. As a result, it is possible to raise an etching ability of the ion gun 26 and to carry out the analysis with a high precision.

The Auger electron collecting portion 37 comprises the detecting part, namely, sensor 38 and a shield member 55. The shield member 55 has a gap 56 between two electrodes 57 and 58 and serves to shield the detecting part 38. The Auger electrons come out of the space through the outlet opening 35 and pass through the gap 56.

The operation of the illustrated analyzing apparatus according to the first embodiment of this invention will be described hereinafter.

Let the analyzing apparatus be fixedly placed in the vacuum vessel (not shown). Under the circumstances, the inside space of the vacuum vessel is evacuated to the pressure less than $10^{-5}$Pa. Then, the analyzing apparatus is operated like each conventional analyzing apparatus illustrated in FIGS. 1 through 3. For example, at first, the ion gun 41 is activated to radiate the ion beam onto the surface of the object 25. The surface of the object 25 is etched by the ion beam and is consequently cleaned. Thereafter, the electron gun 41 is activated to radiate the electron beam onto the cleaned surface to make the surface emit the Auger electrons. The Auger electrons which have specific kinetic energy peculiar to each chemical element travel through a path of the cylindrical mirror type analyzer 31 similar to that described in conjunction with FIGS. 1 to 3 and reach the detecting part 38. The detecting part 38 produces an electrical output signal corresponding to the specific kinetic energy. Such an electrical output signal is processed to carry out the elementary analysis of the surface of the object 25 in the well-known manner.

In the analyzing apparatus according to the first embodiment of this invention, it is possible to place the electron beam radiating opening 45 in close vicinity of the surface of the object 25 as in the above-mentioned analyzing apparatus shown in FIGS. 2 and 3. Therefore, the electron beam has a small diameter on the surface of the object 25. As a result, it is possible to obtain a high spatial resolution of analysis. Inasmuch as the high spatial resolution is achieved by inclining the electron gun axis relative to the principal axis 21, the analyzing apparatus according to the first embodiment of this invention is simpler in structure than the conventional analyzing apparatus shown in FIGS. 2 and 3. In this event, the angle between the electron gun axis and the principal axis 21 is very small, as mentioned before. A reduction of the size of the electron gun 26 becomes unnecessary. In addition, no aperture may be formed on the detecting part 38.

In addition, the electron gun 41 may be long without restriction of the length of the inner cylindrical electrode member 33 in the analyzing apparatus according to the first embodiment of this invention. Therefore, it is possible to dispose a lens system having a large reduction rate of the electron image within the electron beam guide tube 46. Use of such a lens system makes it possible to reduce a diameter of the electron beam on the surface of the object 25. Therefore, the spatial resolution of analysis is improved extremely.

Furthermore, the fine adjustment mechanism 48 may be disposed between the electron beam source 42 and the electron guide tube 41. This is because the electron beam source 42 is positioned outwardly of the analyzer 31 and a spatial margin is therefore allowed for the electron beam source 42. The fine adjustment mechanism 48 serves to make the electron beam from the electron beam source 42 coincide with the electron gun axis. Inasmuch as a reduction of the disalignment is possible between the electron beam and the electron beam source 42, the beam size of the electron beam can be reduced on the surface of the object 25.

In the analyzing apparatus according to the first embodiment of this invention, it is possible to obtain a high resolution in the direction of the depth of the object 25. The reason will be described referring to FIGS. 6 and 7.

Figure 6:
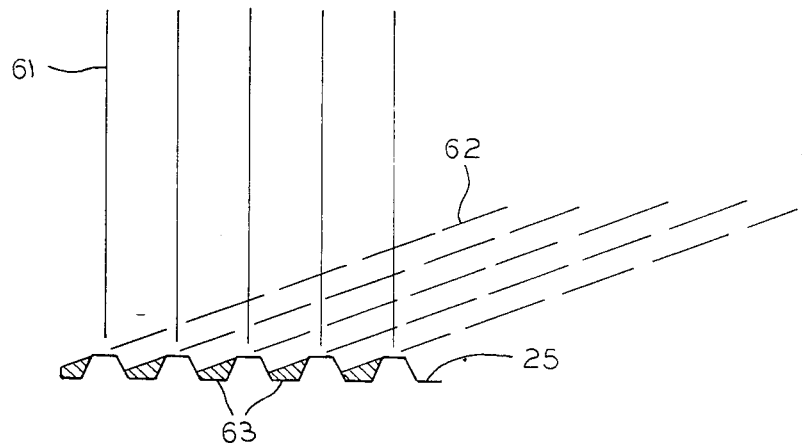
FIG. 6 is a schematic view for use in describing a resolution defined in the direction of the depth of an object in either of the conventional analyzing apparatus shown in FIGS. 2 and 3.

FIG. 6, it is general that the object 25 has a rugged surface having a lot of projections and recessed portions. In either of the conventional analyzing apparatus shown in FIGS. 2 and 3, a large angle is formed between the electron beam 61 radiated by the electron gun 26 and the ion beam 62 radiated by the ion gun 41 because the ion gun 41 is placed outside the analyzer 31. The angle between the electron beam 61 and the ion beam 62 may be, for example, between 70° and 80°. The projections of the object 25 throws a lot of shadows 63 onto the recessed portions of the object 25 on radiation of the ion beam 62. Each shadow becomes long as an increase of the angle between the ion and the electron beams 62 and 61 and gives rise to unetched portions on the object 25. When the electron beam 61 is radiated onto the rugged surface, the Auger electrons emitted from the unetched portions are mixed with the Auger electrons emitted from etched portions. Such a mix of the Auger electrons results in lowering the resolution of analysis defined in the direction of the depth of the object 25.

Figure 7:
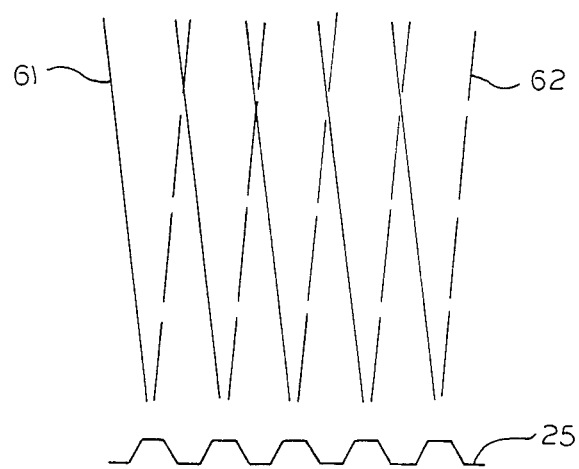
FIG. 7 is a similar view for use in describing the resolution in the analyzing apparatus shown in FIGS. 4 and 5.

As shown in FIG. 7, the analyzing apparatus according to the first embodiment of this invention can reduce the angle between the electron beam 61 and the ion beam 62 because both of the electron gun and the ion gun are placed in the inner room. The angle is, for example, between 10° and 20°. As a result, the above-mentioned shadows hardly occur. It is therefore possible to obtain high resolution in the direction of depth of the object 25 even if the object 25 has a rugged surface.

According ot the apparatus illustrated in FIGS. 4 and 5, the loss of collection of the Auger electrons can be decreased because the electron beam guide tube 46 and the ion beam guide tube 51 can be rendered slim at portions 47 and 53 at which the electron beam guide tube 46 and the ion beam guide tube 51 intersect the Auger electrons. The portions 47 and 53 may be called slim portions.

Inasmuch as both the electron gun 26 and the ion gun 41 are placed in the inner room of the analyzer 31, assembly and disassembly are easy on manufacturing and maintaining the apparatus.

It is known in the art that each analyzing apparatus can be evaluated by the use of the factor defined in the direction of depth of the object 25. The smaller the factor is, the better the analyzing apparatus is.

Figure 8:
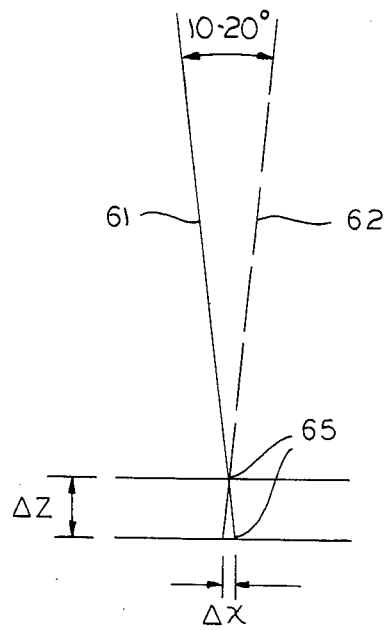
FIG. 8 is a view for use in describing operation of the analyzing apparatus shown in FIGS. 4 and 5.

Referring to FIG. 8, the above-mentioned factor will be calculated in connection with the analyzing apparatus illustrated in FIGS. 4 and 5 on condition that the angle between the electron and the ion beams 61 and 62 is between 10° and 20°. When an amount of displacement of the surface 65 of the object 25 is represented by $\Delta z$ and the dislocation between the electron gun 61 and the ion beam 62 on the surface 65 is represented by $\Delta x$, the factor is given $\Delta x/\Delta z$ and is between 0.2 and 0.4 for the angle between 10° and 20°.

Figure 9:
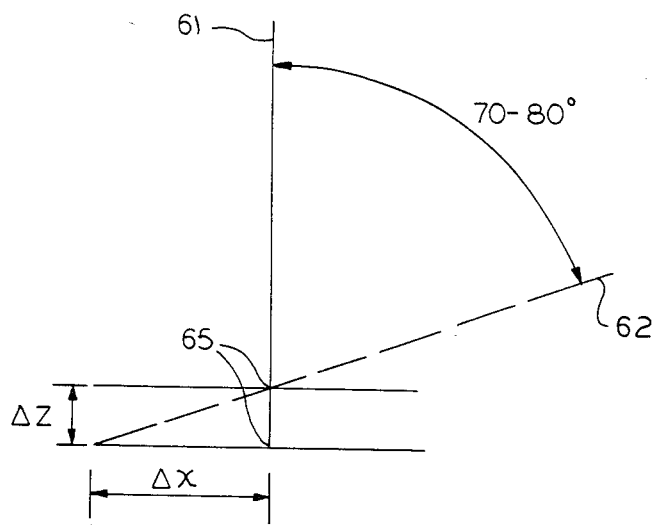
FIG. 9 is a similar view for use in describing operation of either of the conventional apparatus shown in FIGS. 2 and 3.

Referring to FIG. 9, the factor $\Delta x/\Delta z$ will be calculated in connection with the conventional apparatus shown in FIGS. 2 and 3 in the above-mentioned manner. Inasmuch as the angle is between 70° and 80° in the conventional analyzing apparatus, the factor $\Delta x/\Delta z$ is between 2.7 and 5.7. Therefore, the conventional apparatus is inferior to the apparatus according to the first embodiment of this invention.

The gap 56 may be varied by the use of an adjusting mechanism (not shown) which can be attached to the analyzer 31 through the opened second inner end. The adjusting mechanism is for varying the length of the gap 56. Such a mechanism enables adjustment of energy resolution of the analyzer 31.

Additionally, an additional mechanism (not shown) may be placed adjacent to the inlet and the outlet openings 34 and 35 so as to vary the length of the inlet and the outlet openings 34 and 35. The additional mechanism can also be attached to the analyzer 31 through the opened second inner end. The mechanism serves to vary the permeability of the Auger electrons through the analyzer 31.

Second Embodiment

Figure 10:
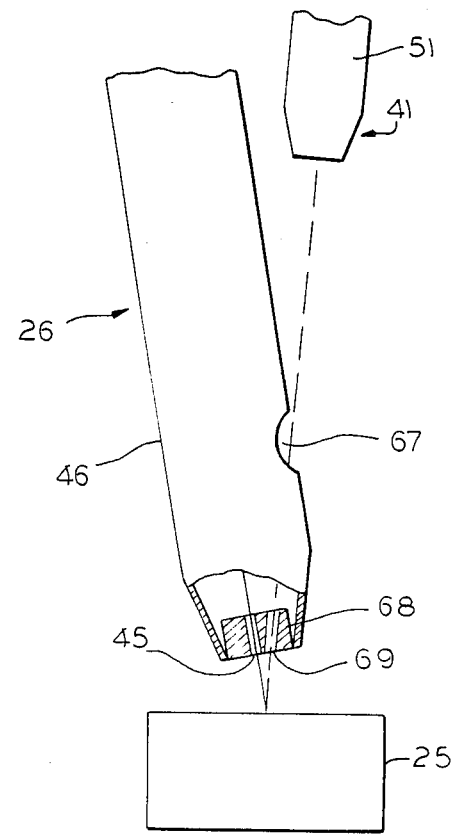
FIG. 10 shows a partial view of an analyzing apparatus according to a second embodiment of this invention, with a portion cut away.

Referring to FIG. 10, an analyzing apparatus according to a second embodiment of this invention comprises similar parts which are designated again by like referenced numerals. The electron gun 26 has a first aperture 67 at the electron beam guide tube 46 in the vicinity of the object 25. The first aperture 67 is for allowing passage therethrough of the ion beam which is radiated by the ion gun 41. An objective lens 68 is disposed in the electron beam guide tube 46 at the lower portion and provides the electron beam radiating opening 45. The objective lens 68 further has a second aperture 69 for allowing passage therethrough of the ion beam. The ion beam is radiated onto the surface of the object 25 through the first and the second apertures 67 and 69. Although the ion beam is slightly spread by the objective lens 68, any trouble does not substantially take place as regards analysis of the Auger electrons. With this structure, the electron beam radiating opening 45 of the electron gun 26 is in close vicinity of the surface of the object 25. This reduces the spherical aberration of the objective lens 68. As a result, it is possible to reduce the spread of the electron beam resulting from the spherical aberration of the objective lens 68.

In the analyzing apparatus being illustrated, the electron gun 26 has apertures 67 and 69 which allow the ion beam to pass therethrough from the ion gun 41. To the contrary, apertures, such as 67 and 69 may be formed on the ion gun 41 to allow the electron beam to pass therethrough from the electron gun 26.

Third Embodiment

Figure 11:
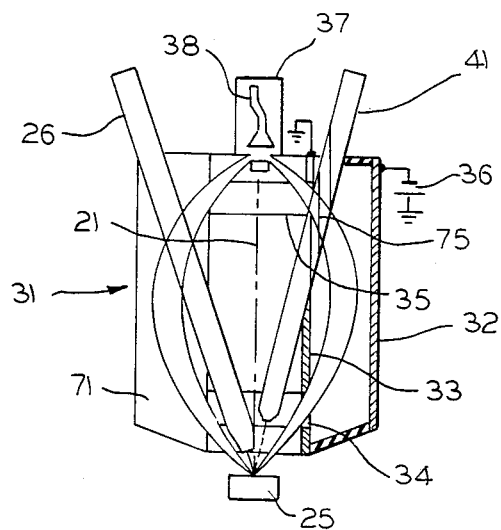
FIG. 11 is a schematic vertical sectional view of an analyzing apparatus according to a third embodiment of this invention.
Figure 12:
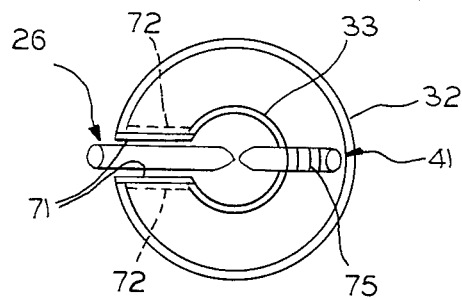
FIG. 12 is a schematic top view of the analyzing apparatus illustrated in FIG. 11.

Referring to FIGS. 11 and 12, an analyzing apparatus according to a third embodiment of this invention comprises similar parts designated by like reference numerals. As illustrated in FIGS. 11 and 12, the electron and the ion guns 26 and 41 are entered into the inner room through the space between the inner and the outer cylindrical members 33 and 32. As a result, the electron gun axis of the electron gun 26 is not extended through the second inner end but through both of the space and the inner cylindrical electrode member 33.

The electron gun 26 is placed between a pair of end walls 71 which are parallel to each other with a spacing left therebetween and which are contiguous to the inner and the outer cylindrical electrode members 33 and 32. Each of the end walls 71 is made of an electrical insulator. Each of the end walls 71 is backed by a plurality of compensating electrodes 72 each of which is insulated from one another and which extends between the first and the second outer ends. Thus, each compensating electrode 72 is attached to a back surface of each end wall 71. The compensating electrodes 72 are for compensating for fluctuation of electric potential between the outer and the inner cylindrical electrode members 32 and 33. The fluctuation of the electric potential results from partially cutting the outer and the inner cylindrical electrode member 32 and 33 and from insertion of the electron gun 26. The compensating electrodes 72 are given an electric potential distribution which can compensate for the fluctuation. Thus, the end walls 71 with the compensating electrodes 72 are operable as a field adjusting member for adjusting the electric field in the space.

The ion gun axis of the ion gun 41 is not extended through the second inner end but through both of the space and the inner cylindrical electrode member 33, like the electron gun axis.

In FIGS. 11 and 12, a plurality of additional compensating electrodes 75 are attached to the ion gun 41 at a portion which lies in the space. The additional compensating electrodes 75 are operable to compensate for the fluctuation of electric potential as well as the compensating electrodes 72 and, therefore, may be referred to as a field adjusting member.

The additional compensating electrodes 75 may be attached to the electron gun 26. In this event, the compensating electrodes 72 become unnecessary as well as the end walls 71.

Fourth Embodiment

Figure 13:
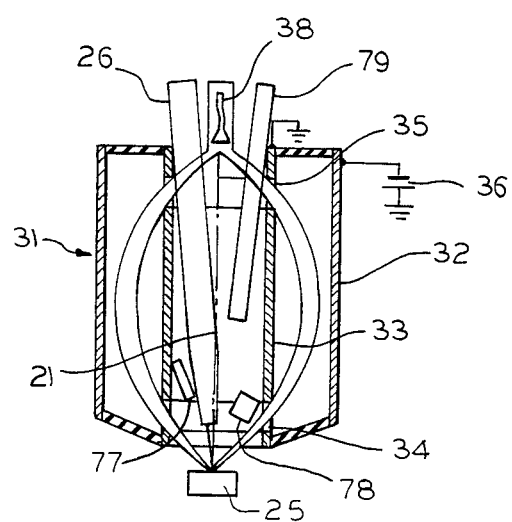
FIG. 13 is a schematic vertical sectional view of an analyzing apparatus according to a fourth embodiment of this invention.

Referrng to FIG. 13, an analyzing apparatus according to a fourth embodiment of this invention comprises similar parts designated by like reference numerals.

The electron gun 26 is extended inside the second inner end of the inner room with the electron gun 26 partly placed outside the second inner end. The analyzing apparatus comprises detectos 77 through 79. The detectors 77 through 79 are for detecting the charged particles which are emitted from the surface of the object 25 but not analyzed by the cylindrical mirror type analyzer 31.

More particularly, the detector 77 is for detecting secondary electrons while the detector 78 for detecting a radiant ray. Both of the detectors 77 and 78 are disposed in the inner room. The detector 79 is for detecting secondary ions and is extended partly in the inner room with a portion of the detector 79 protruded outside the second inner end of the inner room. The detector 79 has a detector axis which forms a preset angle with the principal axis 21. The detector axis is coplanar with the principal axis 21 and yet is not concurrent with the principal axis 21. The illustrated detector axis is also coplanar with the electron gun axis.

Although all of the detector axis, the principal axis 21, and the electron gun axis are on a coplanar plane in the example being illustrated, the electron gun axis may be on a plane different from the detector axis and the principal axis.

Electron Gun

Figure 14:
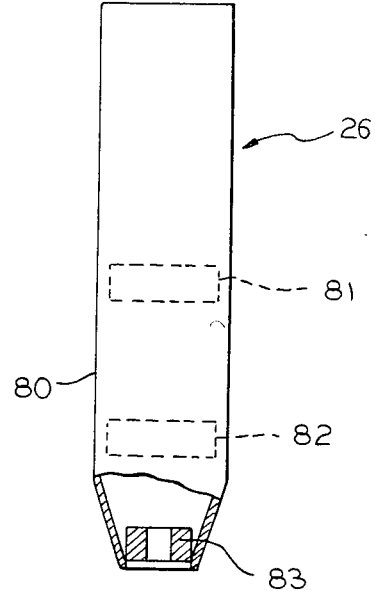
FIG. 14 shows a side view for describing an electron gun used in each analyzing apparatus according to the first through the fourth embodiments of this invention, with a portion cut away.

Referrng to FIG. 14, an example of the electron gun 26 comprises a member 80 having an arrangement of a first electrostatic lens 81, a second electrostatic lens 82, and an objective lens 83. The member 80 serves to direct an electron beam radiated from the electron beam source (FIG. 4) onto the surface of the object 25. The objective lens comprises a permanent magnet. The objective lens 83 serves to reduce a beam size of the electron beam.

In FIG. 4, a magnetic field generating device may be arranged inwardly of the electron beam guide tube 46 to apply a magnetic field to the electron beam generated by the electron beam source 42 of the electron gun 26. The magnetic field and consequently the magnetic field generating device is symbolized at 85. When the magnetic field is directed perpendicularly of the figure towards the backward side of FIG. 4, the electron beam is deflected leftwardly of the figure. This will enable the electron beam to be incident on the surface of the object 25 nearly at right angles. The magnetic field generating device may be an electromagnet. Alternatively, the magnetic field generating device may be a permanent magnet placed within the electron beam guide tube 46. As a further alternative, an electric field generating device may be used in directing the electron beam as desired.

While the present invention has thus far been described in conjunction with a few preferred embodiments thereof, it will now be readily possible for those skilled in the art to practice this invention in various other manners. For example, the slim portions 47 and 53 may selectively be cut away from the electron beam guide tube 46 and the ion beam guide tube 51 to expose the electron beam and the ion beam to the inner room. With this structure, intersection can almost completely be avoided between the Auger electrons and the electron beam and/or between the Auger electrons and the ion beam. Various beam radiators, such as a neutron gun, X-ray gun, ultraviolet ray gun, may be used instead of the electron gun 26 and the ion gun 41. Each radiator axis may not be extended through the second outer end.

What is claimed is:

1. In an analyzing apparatus having a principal axis and comprising holding means for holding an object having a surface with said surface disposed transversely of said principal axis, beam radiating means for radiating a radiant beam onto said surface to make said surface emit charged particles, and a cylindrical mirror type analyzer which comprises an outer and an inner cylindrical electrode member having a common cylinder axis coincident with said principal axis to define a space therebetween, said outer and said inner cylindrical electrode members defining an outer and an inner room, respectively, said inner cylindrical electrode member having an inlet and an outlet opening which surround said principal axis adjacent and remote from said holding means, respectively, said cylindrical mirror type analyzer being for analyzing the charged particles which enter said space through said inlet opening to come out thereof through said outlet opening, the improvement wherein said beam radiating means comprises:

a beam radiator having a radiator axis and a beam radiating opening for radiating said radiant beam through said radiating opening, said radiator axis being extended at least partly in said outer room and being noncoincident with said principal axis, said beam radiating opening being disposed adjacent to said holding means; and directing means for directing the radiant beam radiated through said beam radiating opening onto said surface at a predetermined angle relative to said principal axis.

2. An analyzing apparatus as claimed in claim 1, said outer and said inner rooms having first outer and inner ends adjacent to said holding means, respectively, and second outer and inner ends remote from said holding means, respectively, wherein said radiator axis is not extended through said second outer end, said beam radiating opening being disposed adjacent to said first inner end.

3. An analyzing apparatus as claimed in claim 1, said outer and said inner rooms having first outer and inner ends adjacent to said holding means, respectively, and second outer and inner ends remote from said holding means, respectively, wherein said radiator axis is extended through said second outer end, said beam radiating opening being disposed adjacent to said first inner end.

4. An analyzing apparatus as claimed in claim 3, wherein said radiator axis is extended through said second inner end.

5. An analyzing apparatus as claimed in claim 3, wherein said radiator axis is not extended through said second inner end but through said space and through said inner cylindrical electrode member adjacently of said outlet opening.

6. An analyzing apparatus as claimed in claim 5, said cylindrical mirror type analyzer further comprising means for generating an electric field in said space, wherein said beam radiator comprises field adjusting means for adjusting said electric field, said first adjusting means being attached to said beam radiator at a portion thereof which lies in said space.

7. An analyzing apparatus as claimed in claim 3, wherein said radiator axis forms said predetermined angle with said principal axis, said directing means being for making the radiant beam radiated through said beam radiating opening proceed without being deflected.

8. An analyzing apparatus as claimed in claim 3, wherein said radiator axis forms an angle with said principal axis, the angle formed between said principal and said radiator axes being different from said predetermined angle.

9. An analyzing apparatus as claimed in claim 3, wherein said radiator axis is coplanar with said principal axis and yet is not concurrent with said principal axis.

10. An analyzing apparatus as claimed in claim 3, said beam radiator comprising a beam source outwardly of said outer room for generating said radiant beam and a guide tube with said beam radiating opening for guiding the radiant beam generated by said beam source along said radiator axis to said beam radiating opening, wherein said guide tube is rendered slim at a portion at which said guide tube intersects said charged particles.

11. An analyzing apparatus as claimed in claim 3, said beam radiator comprising a beam source outwardly of said outer room for generating said radiant beam and a guide tube with said beam radiating opening for guiding the radiant beam generated by said beam source along said radiator axis to said beam radiating opening, wherein said guide tube comprises a first and a second tube portion, said first tube portion being extended along said radiator axis from said beam source to a position at which said guide tube intersects said charged particles, said second tube portion being extended along said radiator axis from said position to said beam radiating opening.

12. An analyzing apparatus as claimed in claim 3, further comprising an etching beam radiator for radiating an etching beam onto said surface to etch said surface, wherein said etching beam radiator is extended at least partly in said outer room.

13. An analyzing apparatus as claimed in claim 12, wherein said etching beam radiator is not extended through said second outer end.

14. An analyzing apparatus as claimed in claim 12, wherein said etching beam radiator is extended through said second outer end.

15. An analyzing apparatus as claimed in claim 14, wherein said etching beam radiator is extended through said second inner end.

16. An analyzing apparatus as claimed in claim 14, wherein said etching beam radiator is not extended through said second inner end but through said space and through said inner cylindrical electrode member adjacently of said outer opening.

17. An analyzing apparatus as claimed in claim 16, said cylindrical mirror type analyzer further comprising means for generating an electric field in said space, wherein said etching beam radiator comprises field adjusting means for adjusting said electric field, said field adjusting means being attached to said etching beam radiator at a portion thereof which lies in said space.

18. An analyzing apparatus as claimed in claim 14, wherein said etching beam radiator has an etching beam radiator axis which forms a preselected angle with said principal axis.

19. An analyzing apparatus as claimed in claim 14, wherein said etching beam radiator has an etching beam radiator axis which is coplanar with said principal axis and yet is not concurrent with said principal axis.

20. An analyzing apparatus as claimed in claim 14, wherein said etching beam radiator has an etching beam radiator axis which is coplanar with said principal axis and the radiator axis of the beam radiator for radiating said radiant beam.

21. An analyzing apparatus as claimed in claim 14, said etching beam radiator comprising an etching beam source outwardly of said outer room for generating said etching beam and an etching beam guide tube with an etching beam radiating opening for guiding the etching beam generated by said etching beam source to said etching beam radiating opening, wherein said etching beam guide tube is rendered slim at a portion at which said etching beam guide tube intersects said charged particles.

22. An analyzing apparatus as claimed in claim 14, said etching beam radiator comprising an etching beam source outwardly of said outer room for generating said etching beam and an etching beam guide tube with an etching beam radiating opening for guiding the etching beam generated by said etching beam source to said etching beam radiating opening, wherein said etching beam guide tube comprises a first and a second tube portion, said first tube portion being extended from said etching beam source to a portion at which said etching beam guide tube intersects said charged particles, said second tube portion being extended from said portion to said etching beam radiating opening.

23. An analyzing apparatus as claimed in claim 12, wherein one of the beam radiator for radiating said radiant beam and said etching beam radiator has an aperture adjacent to said first inner end, said aperture being for allowing passage therethrough of one of the radiant and the etching beams that is radiated by the other of the beam radiator for radiating said radiant beam and said etching beam radiator.

24. An analyzing apparatus as claimed in claim 3, further comprising a detector for detecting the charged particles which are emitted from said surface and are not analyzed by said cylindrical mirror type analyzer, wherein said detector is extended at least partly in said outer room.

25. An analyzing apparatus as claimed in claim 24, wherein said detector is not extended through said second outer end.

26. An analyzing apparatus as claimed in claim 24, wherein said detector is extended through said second outer end.

27. An analyzing apparatus as claimed in claim 24, wherein said detector is extended through said second inner end.

28. An analyzing apparatus as claimed in claim 26, wherein said detector is not extended through said second inner end but through said space and through said inner cylindrical electrode member adjacently of said outlet opening.

29. An analyzing apparatus as claimed in claim 26, wherein said detector has a detector axis which forms a preset angle with said principal axis.

30. An analyzing apparatus as claimed in claim 26, wherein said detector has a detector axis which is coplanar with said principal and yet is not concurrent with said principal axis.

31. An analyzing apparatus as claimed in claim 26, wherein said detector has a detector axis which is coplanar with said principal axis and said radiator axis.

32. An analyzing apparatus as claimed in claim 26, wherein said detector has a detector axis, said detector axis and said principal axis being on a coplanar plane which does not include said radiator axis.

* * * * *